TRANSISTOR OSCILLATOR CONTROLLABLE IN FREQUENCY

Filed May 18, 1960

INVENTORS
JOHANNES NOORDANUS
MARIE M.A.A.G. VERSTRAELEN
BY
AGENT

United States Patent Office 3,192,487
Patented June 29, 1965

3,192,487
TRANSISTOR OSCILLATOR CONTROLLABLE IN FREQUENCY

Johannes Noordanus and Marie Marcel Antoine Arnold Ghislain Verstraelen, Hilversum, Netherlands, assignors to North American Philips Company Inc., New York, N.Y., a corporation of Delaware Filed May 18, 1960, Ser. No. 29,876
Claims priority, application Netherlands, May 23, 1959, 239,492
5 Claims. (Cl. 331—117)

The invention relates to a transistor oscillator, which is controllable in frequency, for example, employed in frequency-modulation arrangements or frequency readjusting circuits. It has particularly for its object to provide an oscillator device of which the amplitude and the frequency are substantially independent of the current amplification factor and further characteristic magnitudes of the transistor, so that the influence of temperature fluctuations and the like is minimized. It has furthermore for its object to economize a separate transistor, producing the modulation, similar to a reactance valve and to permit, nevertheless, a frequency variation which is at least substantially linear with a control-magnitude.

In a known frequency-modulation oscillator device of this kind the control-magnitude is fed, in order to avoid unwanted amplitude modulation, simultaneously to two electrodes of the transistor. The adjustment required to this end is fairly strongly dependent upon the transistor specimen employed. The frequency sweep obtained may vary fairly satisfactorily in line with the control-magnitude, but it also depends strongly upon the transistor specimen used.

The invention is based on a phenomenon, which has hitherto not been observed with transistor oscillators, that under certain conditions collector-base rectification may occur in the transistor. This phenomenon is utilized in the device according to the invention to convey an additional current varying with the bias adjustment of the transistor through the oscillator circuit, which current has a phase shift with respect to the circuit voltage and thus produces detuning of the oscillator.

The invention is characterized in that the voltage produced across the oscillator resonant circuit renders the transistor conductive only for part of its oscillatory period and then occurs with so high an amplitude at the collector of the transistor that during a part of the oscillatory period controllable by the transistor bias current the total collector current in the transistor inverts its polarity.

The invention will be described with reference to a drawing, in which

Figure 1:
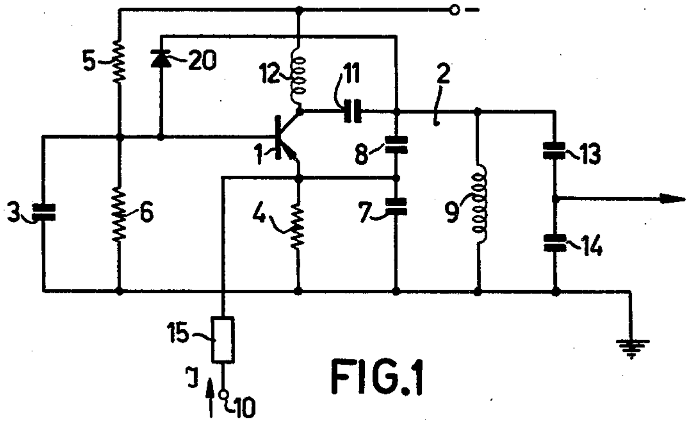
FIG. 1 shows one embodiment.

The device shown in FIG. 1 comprises a junction transistor 1, which is connected, by means of collector-emitter feed-back circuit 2, as an oscillator with a frequency determined in the first place by the tuning frequency of the circuit 2. In order to reduce the variation of the frequency with temperature- and supply-voltage-fluctuations, the base electrode of the transistor 1 is connected to earth for the oscillator oscillations by means of a capacitor 3, whilst the emitter conductor includes a comparatively great resistor 4. The base bias voltage is produced with the aid of a potentiometer 5, 6.

Figure 2:
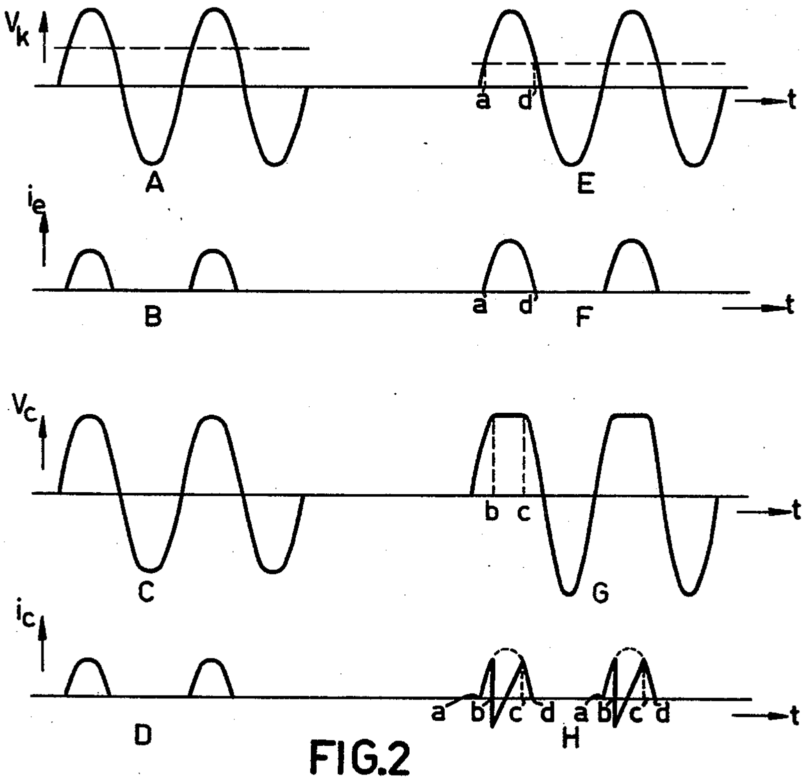
FIG. 2 shows voltage- and current-time diagrams to explain FIG. 1.

In FIGS. 2A–D the situation is illustrated at the beginning of the frequency-control range, where substantially no collector-base rectification occurs. Across the circuit 2 is produced a substantially sinusoidal voltage $V_k$ (FIG. 2A). Owing to the bias adjustment with the aid of the resistors 4, 5 and 6, whilst in addition the additional currents due to emitter-base rectification in these resistors are to be taken into account, only the peaks of the voltage $V_k$ exceeding the broken line of FIG. 2A will open the transistor. The emitter current $i_e$ then flowing is illustrated in FIG. 2B. This current produces a substantially identical collector current $i_c$ (FIG. 2D) and a substantially sinusoidal collector voltage $V_c$ (FIG. 2C), so that the oscillation is maintained.

The supply of a control-magnitude to the terminal 10 changes the situation as is illustrated in FIGS. 2E–H. The threshold indicated by the broken line in FIG. 2E which the circuit voltage $V_k$ has to exceed to produce current conduction in the transistor, is lowered by the control-current I. Consequently, the emitter current $i_e$ flows for a longer time and attains a higher amplitude (FIG. 2F). The corresponding collector voltage $V_c$ has a waveform as is illustrated in FIG. 2G. At the instant *b*, when this voltage begins to exceed the direct-voltage difference prevailing between the collector and the base, collector-base-rectification occurs. The positive peaks of the voltage $V_c$ are thus smoothed and the current $I_c$ changes its polarity (FIG. 2H). The voltage across the circuit capacity has become substantially constant at the instant *b*, so that the current passing through this capacity becomes substantially zero. The negative current passing through the circuit inductance then flows away via the collector-base path and varies subsequently approximately linearly with time with a slope determined by this inductance and the value of the voltage produced across it. It continues flowing until at the instant *c* the emitter current $i_e$ (FIG. 2F) has dropped to a value corresponding with the linearly increased current passing through the circuit inductance (FIG. 2H). The voltage $V_c$ continues its sinusoidal variation from the instant *c*. The period of the sinusoidal oscillation has thus been prolonged by the time *b–c*, so that the frequency produced is reduced accordingly.

For the time interval *d–a* the transistor is therefore blocked and the circuit 2 oscillates freely in its natural frequency. For the intervals *a–b* and *c–d* the transistor is released and supplies energy to the current. For the interval *b–c* the collector-base path of the transistor constitutes substantially a short-circuit parallel to the circuit, the excess of energy being conducted away and the period of the produced oscillation is prolonged.

With an increasing emitter bias current the oscillation tends to build up more strongly, i.e., the times *a–b* and *c–d* are slightly reduced. Owing to the fixed bias adjustment of the base-emitter voltage the limitation by collector-base rectification starts, whilst the amplitude remains substantially constant, so that amplitude variations owing to the control are avoided. The duration *b–c* and the value (FIG. 2H) of the inverse current produced by this rectification across the circuit 2 increase, however, strongly, so that the frequency of the oscillator becomes lower. In practice it is found that the frequency variation obtained is substantially proportional to the control-current fed via the terminal 10 to the emitter of the transistor.

In a practical embodiment a transistor 1 of the type OC 170 was employed. The circuit elements had the following values:

| Capacitors | Resistors |
|---|---|
| 3=4700 pf. | 4=3.3K ohms |
| 7=3900 pf. | 5=2.2K ohms |
| 8=220 pf. | 6=2.2K ohms |
| 11=220 pf. | 15=5.6K ohms |
| 13=150 pf. | Inductances |
| 14=2200 pf. | 9=12 μh. |
| | 12=1 mh. |

The supply voltage was 12 v. The frequency produced was 2 mc./s. and was detunable over a width of 75 kc./s. with the aid of a current of 2 ma. or a voltage of 12 v. at the terminal 10.

If desired, the capacitor 11 may be omitted, so that also the inductor 12 may be dispensed with and the collector supply takes place via the inductor 9. In order to limit also the negative peaks of the oscillation produced, a rectifier 20 may be furthermore connected between the circuit 2 and the base of the transistor 1, held at a constant bias voltage. This rectifier may be of the type *OA* 9. In the case of equal values of the resistors 5 and 6 a symmetrical limitation is obtained.

What is claimed is:

1. An oscillator comprising a transistor having emitter, base and collector electrodes, means providing a bias voltage between said base and emitter electrodes, resonant circuit means connected between said emitter and collector electrodes in a positive feedback arrangement and proportioned to produce oscillations of sufficient amplitude at the collector electrode to cause the total collector current of said transistor to invert its polarity during a portion of each cycle of said oscillations, said bias voltage having a magnitude that permits emitter current in said transistor during only a part of each said cycle, and means for varying said bias voltage whereby the frequency of said oscillations is varied.

2. An oscillator comprising a transistor having emitter, base and collector electrodes, a source of operating voltage having first and second terminals, means providing an emitter-base bias voltage for said transistor comprising resistor means connected between said first terminal and emitter electrode, and potentiometer circuit means connected between said first and second terminals and having a tap connected to said base electrode, resonant circuit means connected between said emitter and collector electrodes in a positive feedback circuit and proportioned to produce oscillations of sufficient amplitude at said collector electrode to cause the total collector current of said transistor to invert its polarity for a portion of each cycle of said oscillations, said bias voltage having sufficient magnitude to permit emitter current in said transistor during only a part of each said cycle, and means for varying said bias voltage whereby the frequency of said oscillations is varied.

3. The circuit of claim 2 comprising rectifier means connected between said resonant circuit and said base electrode.

4. An oscillator comprising a transistor having emitter, base, and collector electrodes, a source of operating voltage having first and second terminals, means providing an emitter-base bias voltage for said transistor comprising resistor means connected between said first terminal and emitter electrode, and potentiometer circuit means connected between said first and second terminals and having a tap connected to said base electrode, a parallel resonant circuit having a tap, means connecting said resonant circuit between said collector electrode and a point of fixed potential, means connecting said tap to said emitter electrode to provide positive feedback, said tap being located in said parallel resonant circuit to provide oscillations of sufficient amplitude at the collector so that the total collector current of said transistor is inverted in polarity during a portion of each cycle of said oscillations, said bias voltage having sufficient magnitude to permit emitter current flow during only a part greater than said portion of each cycle of oscillations, and means for varying said bias voltage for varying the frequency of said oscillations.

5. An oscillator comprising a transistor having base, emitter, and collector electrodes, positive feedback circuit means including a frequency determining resonant circuit connected regeneratively between said emitter and collector electrodes whereby oscillations are produced, means providing a base-emitter bias for said transistor of sufficient amplitude that the emitter-collector path of said transistor is conductive during only a part of each cycle of said oscillations, said positive feedback circuit means being proportioned to produce oscillations of sufficient amplitude at said collector electrode that the direct voltage between said base and collector electrodes is exceeded during a portion of said part of each cycle of oscillations whereby the total collector current of said transistor is inverted, and means for varying said bias voltage for varying the frequency of said oscillations.

References Cited by the Examiner

UNITED STATES PATENTS

| | | | |
|---|---|---|---|
| 2,760,070 | 8/56 | Keonjian | 331—109 |
| 2,771,584 | 11/56 | Thomas | 332—16 |
| 2,951,995 | 8/60 | Rosier et al. | 332—16 |

OTHER REFERENCES

Article by Fleming in Electronics, June 1953, pages 196, 198.

Article by Keonjian in Electrical Engineering, August 1955, pages 672–674.

ROY LAKE, *Primary Examiner.*

GEORGE N. WESTBY, JOHN KOMINSKI, *Examiners.*

UNITED STATES PATENT OFFICE
CERTIFICATE OF CORRECTION

Patent No. 3,192,487 June 29, 1965

Johannes Noordanus et al.

It is hereby certified that error appears in the above numbered patent requiring correction and that the said Letters Patent should read as corrected below.

Column 2, line 41, for "current" read -- circuit --.

Signed and sealed this 21st day of June 1966.

(SEAL)
Attest:

ERNEST W. SWIDER
Attesting Officer

EDWARD J. BRENNER
Commissioner of Patents